US012362215B2

(12) United States Patent
Shindo et al.

(10) Patent No.: US 12,362,215 B2
(45) Date of Patent: Jul. 15, 2025

(54) APPARATUS FOR TRANSFERRING SUBSTRATE AND METHOD FOR TRANSFERRING SUBSTRATE

(71) Applicant: TOKYO ELECTRON LIMITED, Tokyo (JP)

(72) Inventors: Takehiro Shindo, Yamanashi (JP); Dongwei Li, Yamanashi (JP); Lingxin Jiang, Yamanashi (JP); Shinya Okano, Yamanashi (JP); Toshiaki Kodama, Yamanashi (JP); Wataru Matsumoto, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 333 days.

(21) Appl. No.: 17/991,345

(22) Filed: Nov. 21, 2022

(65) Prior Publication Data
US 2023/0170239 A1    Jun. 1, 2023

(30) Foreign Application Priority Data
Nov. 29, 2021  (JP) ................................ 2021-193577

(51) Int. Cl.
*H01L 21/67*    (2006.01)
*H01L 21/673*    (2006.01)
*H01L 21/677*    (2006.01)

(52) U.S. Cl.
CPC .. *H01L 21/67748* (2013.01); *H01L 21/67265* (2013.01); *H01L 21/67333* (2013.01)

(58) Field of Classification Search
None
See application file for complete search history.

(56) References Cited

U.S. PATENT DOCUMENTS

| 7,193,493 | B2 | 3/2007 | Asano et al. |
| 7,330,093 | B2 | 2/2008 | Asano et al. |
| 8,357,286 | B1 * | 1/2013 | Molnar ................. B24B 37/005 |
| | | | 216/84 |
| 9,298,106 | B1 * | 3/2016 | Ummethala ........ G03F 7/70725 |
| 10,056,279 | B2 | 8/2018 | Janakiraman et al. |
| 10,734,265 | B2 | 8/2020 | Janakiraman et al. |
| 2004/0112164 | A1 | 6/2004 | Asano et al. |

(Continued)

FOREIGN PATENT DOCUMENTS

| JP | H06-183562 A | 7/1994 |
| JP | 2004-146807 A | 5/2004 |

(Continued)

*Primary Examiner* — Truc M Do
(74) *Attorney, Agent, or Firm* — Fenwick & West LLP

(57) ABSTRACT

An apparatus for transferring a substrate to a substrate processing chamber. The apparatus comprises: a substrate transfer chamber having a floor and a side wall; a substrate transfer module comprising a holder and second magnets, and configured to be movable in the substrate transfer chamber by magnetic levitation; and a controller configured to control an operating force for moving the substrate transfer module. The controller comprises: a parameter storage configured to store at least one model parameter; a control schedule creating section configured to acquire identification information and a movement schedule, to obtain the operating force, and to output a control schedule; and a magnetic force adjusting section configured to perform feedforward control.

16 Claims, 14 Drawing Sheets

(56) References Cited

U.S. PATENT DOCUMENTS

| | | |
|---|---|---|
| 2006/0028310 A1 | 2/2006 | Asano et al. |
| 2013/0035020 A1* | 2/2013 | Molnar ................ B24B 37/005 |
| | | 451/11 |
| 2013/0140372 A1* | 6/2013 | Mahadeswaraswamy .................. |
| | | H01L 21/67248 |
| | | 236/12.1 |
| 2016/0218029 A1 | 7/2016 | Janakiraman et al. |
| 2017/0004984 A1* | 1/2017 | Nagaike ............... G01N 29/036 |
| 2018/0308735 A1 | 10/2018 | Janakiraman et al. |
| 2018/0367067 A1* | 12/2018 | Yang .................... H02K 41/031 |
| 2023/0170239 A1* | 6/2023 | Shindo .............. H01L 21/67196 |
| | | 414/749.1 |

FOREIGN PATENT DOCUMENTS

| | | |
|---|---|---|
| JP | 2018-504784 A | 2/2018 |
| KR | 10-2017-0106464 A | 9/2017 |
| WO | WO 2016/118335 A1 | 7/2016 |

\* cited by examiner

APPARATUS FOR TRANSFERRING SUBSTRATE AND METHOD FOR TRANSFERRING SUBSTRATE

CROSS-REFERENCE TO RELATED APPLICATIONS

This application claims priority to Japanese Patent Application No. 2021-193577 filed on Nov. 29, 2021, the entire contents of which are incorporated herein by reference.

TECHNICAL FIELD

The present disclosure relates to an apparatus for transferring a substrate and a method for transferring a substrate.

BACKGROUND

For example, in an apparatus (wafer processing apparatus) that performs processing on a semiconductor wafer (hereinafter, also referred to as a "wafer") which is a substrate, the wafer is transferred between a carrier accommodating the wafer and a wafer processing chamber in which processing is performed. Various types of wafer transfer mechanisms are used to transfer the wafer.

The applicant is developing a wafer processing apparatus for transferring a substrate using a substrate transfer module that utilizes magnetic levitation.

For example, Japanese Laid-open Patent Publication No. 2018-504784 discloses a substrate carrier that utilizes magnetic levitation to transport a semiconductor substrate between processing chambers while floating from a plate.

SUMMARY

The present disclosure provides a technology for performing accurate movement control even when transferring an object to be transferred other than a substrate using a substrate transfer module.

In accordance with an aspect of the present disclosure, there is provided an apparatus for transferring a substrate to a substrate processing chamber. The apparatus comprises: a substrate transfer chamber having a floor provided with first magnets capable of adjusting a magnetic force and a side wall connected to the substrate processing chamber and formed with an opening through which the substrate is loaded into and unloaded from the substrate processing chamber; a substrate transfer module comprising a holder configured to be capable of holding each of a plurality of types of objects to be transferred, which are the substrates or equipment used in the substrate transfer chamber or the substrate processing chamber, and second magnets having a repulsive force acting on the first magnets, the substrate transfer module being configured to be movable in the substrate transfer chamber by magnetic levitation using the repulsive force; and a controller configured to control an operating force for moving the substrate transfer module using feedforward control by adjusting a magnetic force of the first magnets to change the repulsive force. The controller comprises: a parameter storage configured to store at least one model parameter for expressing a relationship between an operating force applied to a control model in which the object to be transferred and the substrate transfer module are integrated and a movement of the control model, the at least one model parameter being stored in association with each of the plurality of types of objects to be transferred; a control schedule creating section configured to acquire identification information for identifying the object to be transferred and a movement schedule defining a movement of the substrate transfer module along a time axis, to obtain the operating force to be applied when the substrate transfer module holding the object to be transferred corresponding to the identification information is moved based on the movement schedule using the model parameter of the control model corresponding to the identification information stored in the parameter storage, and to output a control schedule defining the operating force along the time axis; and a magnetic force adjusting section configured to perform the feedforward control by adjusting the magnetic force of the first magnets so that the operating force based on the control schedule is applied to the substrate transfer module transferring the object to be transferred corresponding to the identification information.

DETAILED DESCRIPTION

<Wafer Processing System>

Hereinafter, a configuration of an "apparatus for transferring a substrate" according to one embodiment of the present disclosure will be described with reference to FIG. 1. The apparatus for transferring a substrate is provided in a wafer processing system 101.

Figure 1:
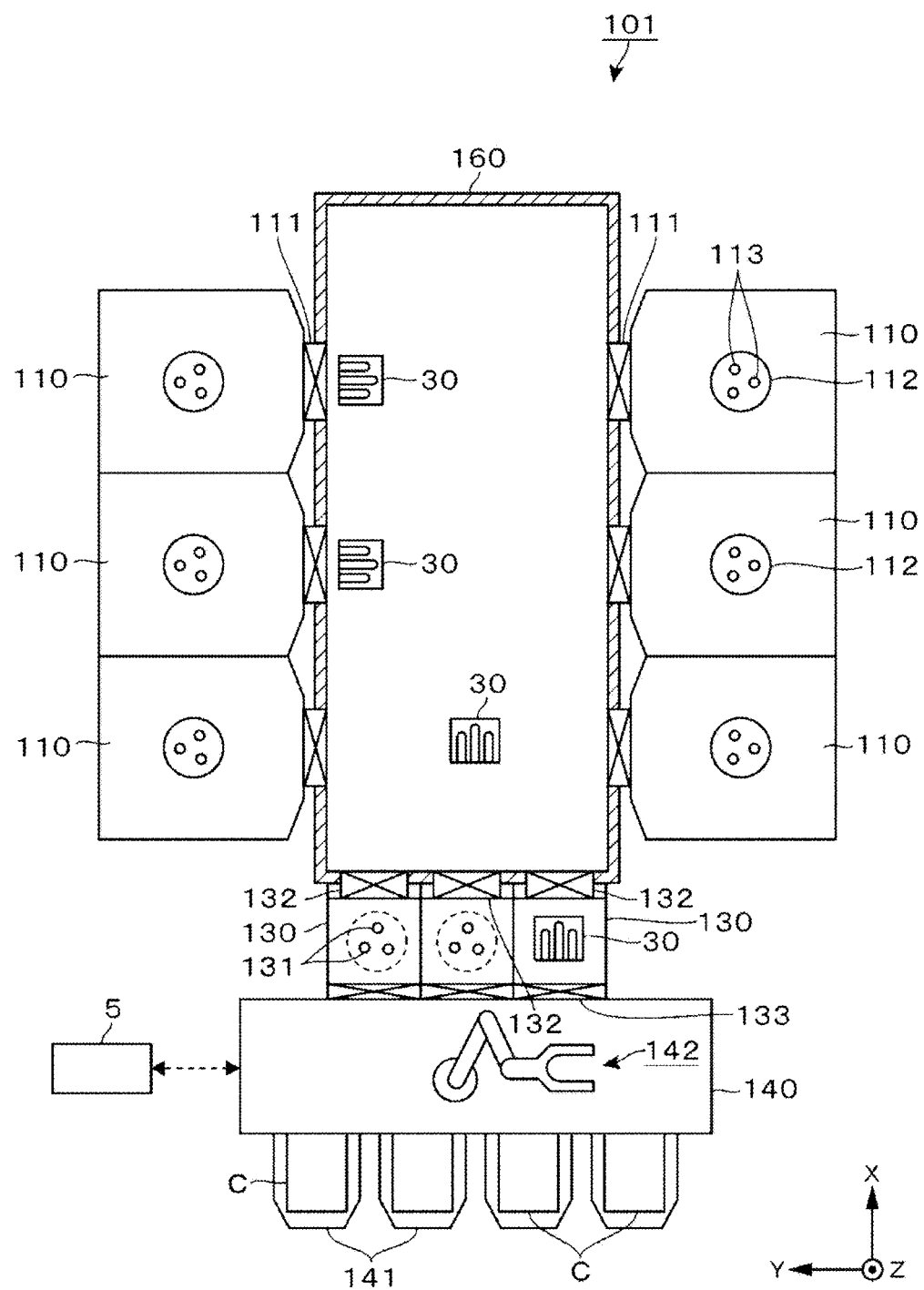
FIG. 1 is a plan view showing a first configuration example of a wafer processing system.

FIG. 1 shows the multi-chamber type wafer processing system 101 including a plurality of wafer processing chambers 110, which are substrate processing chambers. As shown in FIG. 1, the wafer processing system 101 includes load ports 141, an atmospheric transfer chamber 140, load lock chambers 130, a vacuum transfer chamber 160, and the plurality of wafer processing chambers 110. In the following description, a position where the load ports 141 are provided is the front side.

In the wafer processing system 101, the load ports 141, the atmospheric transfer chamber 140, the load lock chambers 130, and the vacuum transfer chamber 160 are horizontally arranged in this order from the front side. In addition, the plurality of wafer processing chambers 110 are provided side by side on the left and right sides of the vacuum transfer chamber 160 as viewed from the front side.

The load ports 141 are configured as placing tables on which a carrier C accommodating a wafer W to be processed is placed, and four load ports 141 are arranged side by side in the horizontal direction as viewed from the front side. As the carrier C, for example, a front opening unified pod (FOUP) can be used.

The atmospheric transfer chamber 140 has an atmospheric pressure (normal pressure) atmosphere, and for example, clean air down flow is formed therein. Further, a wafer transfer mechanism 142 for transferring the wafer W is provided inside the atmospheric transfer chamber 140. The wafer transfer mechanism 142 in the atmospheric transfer chamber 140 is composed of, for example, a multi-joint arm. The wafer transfer mechanism 142 transfers the wafer W between the carrier C and the load lock chamber 130. In addition, an alignment chamber (not shown) in which alignment of the wafer W is performed is provided, for example, on the left side of the atmospheric transfer chamber 140.

Between the vacuum transfer chamber 160 and the atmospheric transfer chamber 140, for example, three load lock chambers 130 are arranged side by side on the left and right. Each load lock chamber 130 has lifting pins 131 that push up and hold the loaded wafer W from below. For example, three lifting pins 131 are provided at equal intervals along the circumferential direction and configured to be liftable. Lifting pins 113, which will be described later, are also configured in the same manner.

The load lock chamber 130 is configured to be able to switch between an atmospheric pressure atmosphere and a vacuum atmosphere. The load lock chamber 130 and the atmospheric transfer chamber 140 are connected via a gate valve 133. Further, the load lock chamber 130 and the vacuum transfer chamber 160 are connected via a gate valve 132.

The vacuum transfer chamber 160 corresponds to a substrate transfer chamber of the present disclosure. As shown in FIG. 1, the vacuum transfer chamber 160 is configured by a housing that is elongated in the front-rear direction and has a rectangular shape in a plan view. The vacuum transfer chamber 160 is depressurized by a vacuum exhaust mechanism (not shown) and has a vacuum atmosphere. In the wafer processing system 101 shown in FIG. 1, three wafer processing chambers 110 are connected to each of the left and right side walls of the vacuum transfer chamber 160 via gate valves 111. That is, a total of six wafer processing chambers 110 are connected. The wafer W is loaded and unloaded between the vacuum transfer chamber 160 and the wafer processing chambers 110 through an opening that is opened and closed by the gate valve 111.

Each wafer processing chamber 110 is depressurized by a vacuum exhaust mechanism (not shown) and has a vacuum atmosphere. A placing table 112 is provided inside each wafer processing chamber 110, and a predetermined processing is performed while the wafer W is placed on this placing table 112. Examples of a processing to be performed on the wafer W can include an etching processing, a film formation processing, a cleaning processing, an ashing processing, and the like.

For example, when performing a processing while heating the wafer W, the placing table 112 is provided with a heater. When a processing to be performed on the wafer W uses a processing gas, the wafer processing chamber 110 is provided with a processing gas supply configured by a shower head or the like. These heater and processing gas supply are omitted from the drawing. In addition, the placing table 112 is provided with the lifting pins 113 for transferring the wafer W to be loaded and unloaded. The wafer processing chamber 110 corresponds to the substrate processing chamber of the present embodiment.

<Transfer Module 30>

Figure 2:
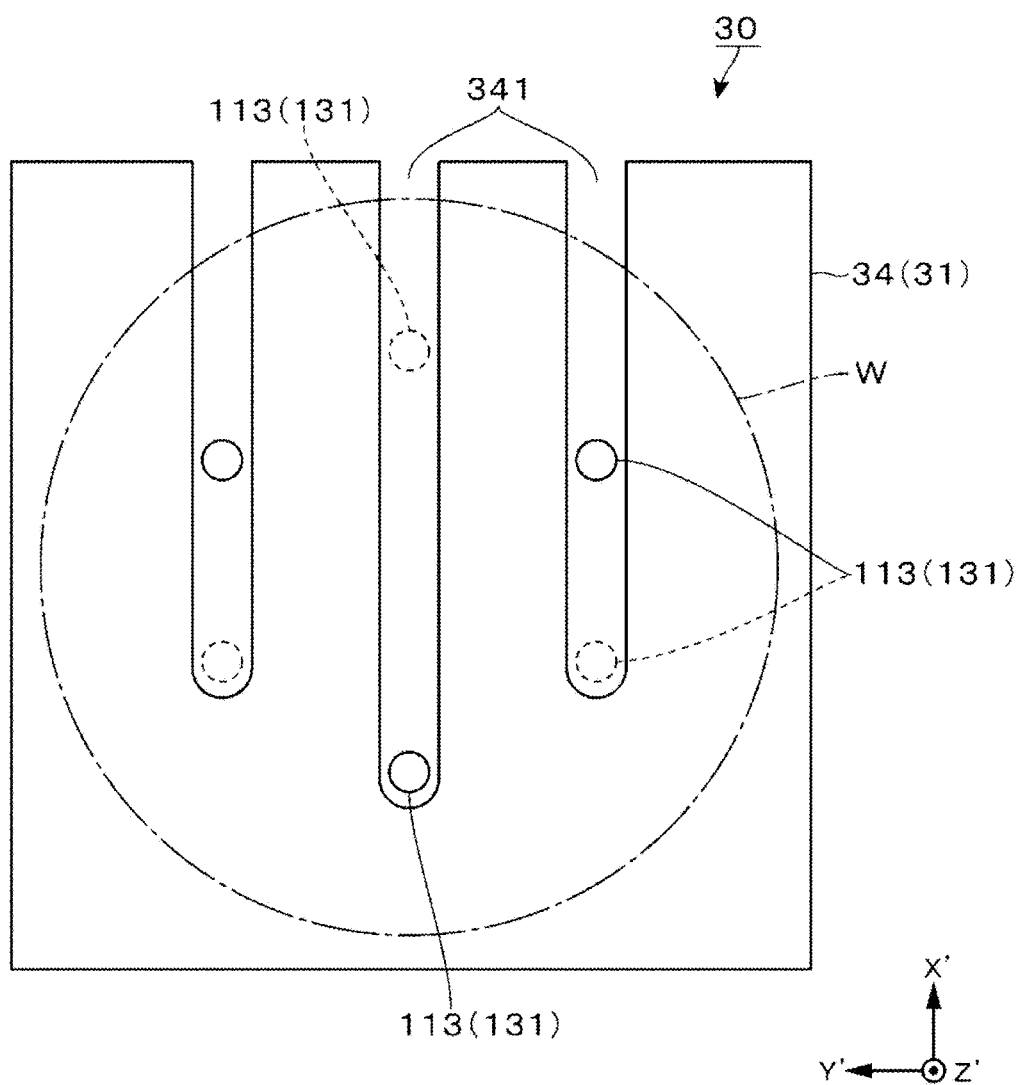
FIG. 2 is a plan view showing a first configuration example of a transfer module.

In the wafer processing system 101 of the present example, the wafer W is transferred using a magnetically levitated transfer module (substrate transfer module) 30. As shown in FIG. 2, the transfer module 30 includes a main body 31 having a rectangular shape in a plan view, and is configured to directly hold the wafer W on the upper surface of the main body 31. That is, the main body 31 of the transfer module 30 serves as a stage 34 that is a holder for holding the wafer W. For example, the stage 34 is formed in the shape of a flat rectangular plate. A module side magnet 33 is provided inside the main body 31 of the transfer module 30, and a configuration example thereof will be described later with reference to FIG. 3.

The transfer module 30 enters the wafer processing chamber 110 and the load lock chamber 130 and transfers the wafer W to and from the lifting pins 113 and 131. The transfer module 30 is formed with slits 341 for transferring the wafer W while avoiding interference with the lifting pins 113 and 131. The slits 341 are formed along paths through which the lifting pins 113 and 131 pass when the stage 34 is moved into and out of a position below the wafer W held by the lifting pins 113 and 131. Further, the slits 341 are formed so that the approach direction toward the position below the wafer W can be reversed by 180°. With this configuration, while avoiding interference between the transfer module 30 and the lifting pins 113 and 131, the transfer module 30 and the wafer W can be arranged vertically with their centers aligned.

<Magnetic Levitation Mechanism>

Figure 3:
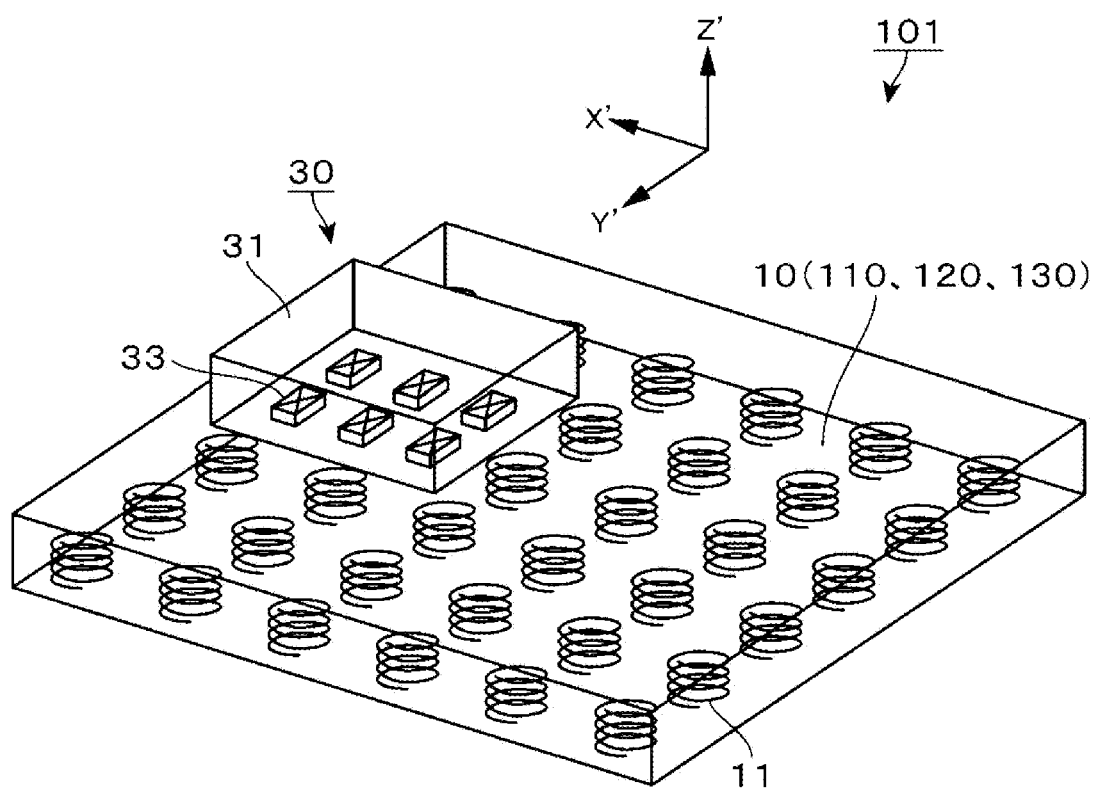
FIG. 3 is a perspective view showing a configuration example of the transfer module and a tile.

As schematically shown in FIG. 3, a plurality of tiles (moving tiles) 10 are provided on the floor of the vacuum transfer chamber 160. These tiles 10 are provided on the entire floor inside the vacuum transfer chamber 160, which is a movement area of the transfer module 30. In addition, since the transfer module 30 of the present example has a transfer area set so as to enter and move into the load lock chamber 130 and the wafer processing chamber 110, the tiles 10 are also provided on floors of the load lock chamber 130 and the wafer processing chamber 110.

A plurality of moving surface side coils 11 are arranged inside each of the tiles 10. The moving surface side coils 11 generate a magnetic field when power is supplied from a power supply 53. The moving surface side coil 11 corresponds to a first magnet of the present disclosure.

On the other hand, inside the transfer module 30, a plurality of module side magnets 33 made up of, for example, permanent magnets are arranged. A repulsive force (magnetic force) acts between the module side magnets 33 and the magnetic field generated by the moving surface side coils 11. By this action, the transfer module 30 can be magnetically levitated with respect to the moving surface on the upper surface side of the tile 10. The module side magnet 33 provided in the transfer module 30 corresponds to a second magnet of the present disclosure.

In addition, the tile 10 can change a state of the magnetic field by adjusting the position where the magnetic field is generated and the intensity of the magnetic force using the plurality of moving surface side coils 11. By controlling the magnetic field in this manner, it is possible to move the transfer module 30 in a desired direction on the moving surface, adjust a floating distance from the moving surface, and adjust the orientation of the transfer module 30. The magnetic field on the tile 10 side is controlled by selecting the moving surface side coils 11 to which power is supplied and by adjusting the magnitude of the power supplied to the moving surface side coils 11.

The plurality of module side magnets 33 may be configured by coils that are supplied with power from a battery provided in the transfer module 30 and function as electromagnets. Moreover, the module side magnets 33 may be configured by providing both permanent magnets and coils.

The plurality of transfer modules 30 are provided in the vacuum transfer chamber 160 configured as described above, and the wafer W can be transferred by simultaneously moving these transfer modules 30.

The vacuum transfer chamber 160 including the transfer modules 30 and connected to the wafer processing chambers 110 described above corresponds to an apparatus for transferring a substrate of the present disclosure.

<Controller 5>

The wafer processing system 101 includes a controller 5. The controller 5 is composed of a computer having a CPU and a storage, and controls each component of the wafer processing system 101. The storage stores a program including a group of steps (instructions) for controlling the movement of the transfer module 30, the operation of the wafer processing chamber 110, and the like. This program is stored in a storage medium such as a hard disk, a compact disk, a magnet optical disk, a memory card, a non-volatile memory, and the like, for example, and installed in the computer therefrom.

<Operation of Transferring Wafer W>

Next, an example of an operation of transferring the wafer W in the wafer processing system 101 having the above configuration will be described. First, when the carrier C accommodating the wafer W to be processed is placed on the load port 141, the wafer W is taken out from the carrier C by the wafer transfer mechanism 142 in the atmospheric transfer chamber 140. Next, the wafer W is transferred to an alignment chamber (not shown) and aligned. Further, when the wafer W is taken out from the alignment chamber by the wafer transfer mechanism 142, the gate valve 133 is opened.

When the wafer transfer mechanism 142 enters the load lock chamber 130, the lifting pins 131 push up the wafer W and receive it. After that, when the wafer transfer mechanism 142 is withdrawn from the load lock chamber 130, the gate valve 133 is closed. Further, the inside of the load lock chamber 130 is switched from the atmospheric pressure atmosphere to the vacuum atmosphere.

When the load lock chamber 130 becomes the vacuum atmosphere, the gate valve 132 is opened. At this time, in the vacuum transfer chamber 160, the transfer module 30 faces the load lock chamber 130 in the vicinity of the connection position with the load lock chamber 130 and waits in a magnetically levitated state.

Then, as shown in FIG. 1, the transfer module 30 enters the load lock chamber 130 and is positioned below the wafer W supported by the lifting pins 131. When the lifting pins 131 are lowered, the wafer W is transferred onto the stage 34 of the transfer module 30.

Next, the transfer module 30 holding the wafer W leaves the load lock chamber 130 and moves in the vacuum transfer chamber 160 along a preset movement path to the wafer processing chamber 110 to which the wafer W is to be transferred. As shown in FIG. 1, when the transfer module 30 reaches a position directly facing the wafer processing chamber 110, the gate valve 111 is opened to allow the transfer module 30 to enter the wafer processing chamber 110. Thereafter, the wafer W is transferred to the placing table 112 via the lifting pins 113, and the transfer module 30 is withdrawn from the wafer processing chamber 110. Further, after the gate valve 111 is closed, the processing of the wafer W is started.

In processing the wafer W, the wafer W placed on the placing table 112 is heated as necessary to a preset temperature. Further, when the processing gas supply is provided, the processing gas is supplied into the wafer processing chamber 110. Thus, a desired processing is performed on the wafer W.

After the wafer W has been processed for a preset period of time, the heating of the wafer W is stopped and the supply of the processing gas is stopped. Further, the wafer W may be cooled by supplying a cooling gas into the wafer processing chamber 110 as necessary. Thereafter, the wafer W is transferred in the reverse order of the loading procedure, and the wafer W is returned from the wafer processing chamber 110 to the load lock chamber 130.

Further, after the atmosphere of the load lock chamber 130 is switched to the normal pressure atmosphere, the wafer W in the load lock chamber 130 is taken out by the wafer transfer mechanism 142 on the atmospheric transfer chamber 140 side and returned to a predetermined carrier C.

<Feedforward Control>

In the operation of transferring the wafer W in the wafer processing system 101 described above, the transfer module 30 moves while floating above the floor of the vacuum transfer chamber 160, the load lock chamber 130, and the wafer processing chamber 110. Movement using magnetic levitation, unlike, for example, a multi-joint arm robot, has little change in physical properties due to friction and change in posture. For this reason, the transfer module 30 can be treated as an ideal rigid body, and the relationship between the force applied from the outside and the movement of the transfer module 30 can be easily specified.

If the above-described relationship can be specified, the position and posture of the transfer module 30 can be scheduled in advance, and based on this schedule, feedforward control (hereinafter also referred to as "FF control") is possible to adjust the force (the repulsive force between the moving surface side coils 11 and the module side magnets 33) applied so that the transfer module 30 moves. The FF control enables control with less delay than a feedback control that adjusts the applied force based on a detection result of the position and posture of the transfer module 30.

Therefore, in the wafer processing system 101 of the present example, the controller 5 described above is configured to control the movement of the transfer module 30 using the FF control.

On the other hand, in the wafer processing chamber 110 and the vacuum transfer chamber 160, various parts are arranged, and repair, replacement, or cleaning of these parts may be required. Further, if various sensors are arranged in the wafer processing chamber 110 and the vacuum transfer chamber 160 as necessary and the internal state can be detected by the sensors, it can be useful for processing the wafer W and improving equipment maintenance. Furthermore, when the wafer W is damaged inside the vacuum transfer chamber 160 or the wafer processing chamber 110 or the transfer module 30 fails, it may be necessary to take out the damaged wafer W or the transfer module 30.

In these cases, it is necessary to take out the parts and the transfer module 30 from the wafer processing chamber 110 and the vacuum transfer chamber 160, or to arrange the sensors inside them. However, in order to perform this work, it is necessary to stop the operation of the wafer processing system 101, return the inside of the wafer processing chamber 110 and the vacuum transfer chamber 160 from the vacuum atmosphere to the atmospheric pressure atmosphere, and then open them. Moreover, in order to restart the operation of the wafer processing system 101, the wafer processing chamber 110 and the vacuum transfer chamber 160 must be depressurized to the vacuum atmosphere again. Since the wafer W cannot be processed during the time required for these operations, it becomes an opportunity loss.

In this regard, the wafer processing system 101 of the present example includes the transfer module 30 that can move within the vacuum transfer chamber 160 and the wafer processing chamber 110. If this transfer module 30 can be used to load and unload part, damaged wafer W, failed transfer module 30, and sensors through the load lock chamber 130, for example, the works of switching the pressure in the wafer processing chamber 110 and the vacuum transfer chamber 160 and opening them become unnecessary.

On the other hand, a transfer of an object to be transferred having a weight and shape different from those of an undamaged wafer W (hereinafter also referred to as a "normal wafer W") causes deterioration of the movement control of the transfer module 30 using the FF control.

Therefore, the wafer processing system 101 of the present example performs the FF control on the assumption that a plurality of types of objects to be transferred, such as parts to be repaired or replaced, damaged wafers W, failed transfer module 30, various sensors, and the like, in addition to the normal wafer W, will be transferred by the transfer module 30.

Here, the parts used in the wafer processing chamber 110 and the vacuum transfer chamber 160, the damaged wafer W, the failed transfer module 30, and the sensor correspond to "equipment used in the vacuum transfer chamber 160 or the wafer processing chamber 110" in the present example. The normal wafer W and a plurality of types of equipment correspond to "objects to be transferred" of the transfer module 30.

The controller 5 is configured to be able to change contents of the FF control according to the types of these objects to be transferred.

Hereinafter, the configuration of the controller 5 related to the movement control of the transfer module 30 and details of the control will be described with reference to FIGS. 4 to 8.

<Detailed Configuration of Controller 5>

Figure 4:
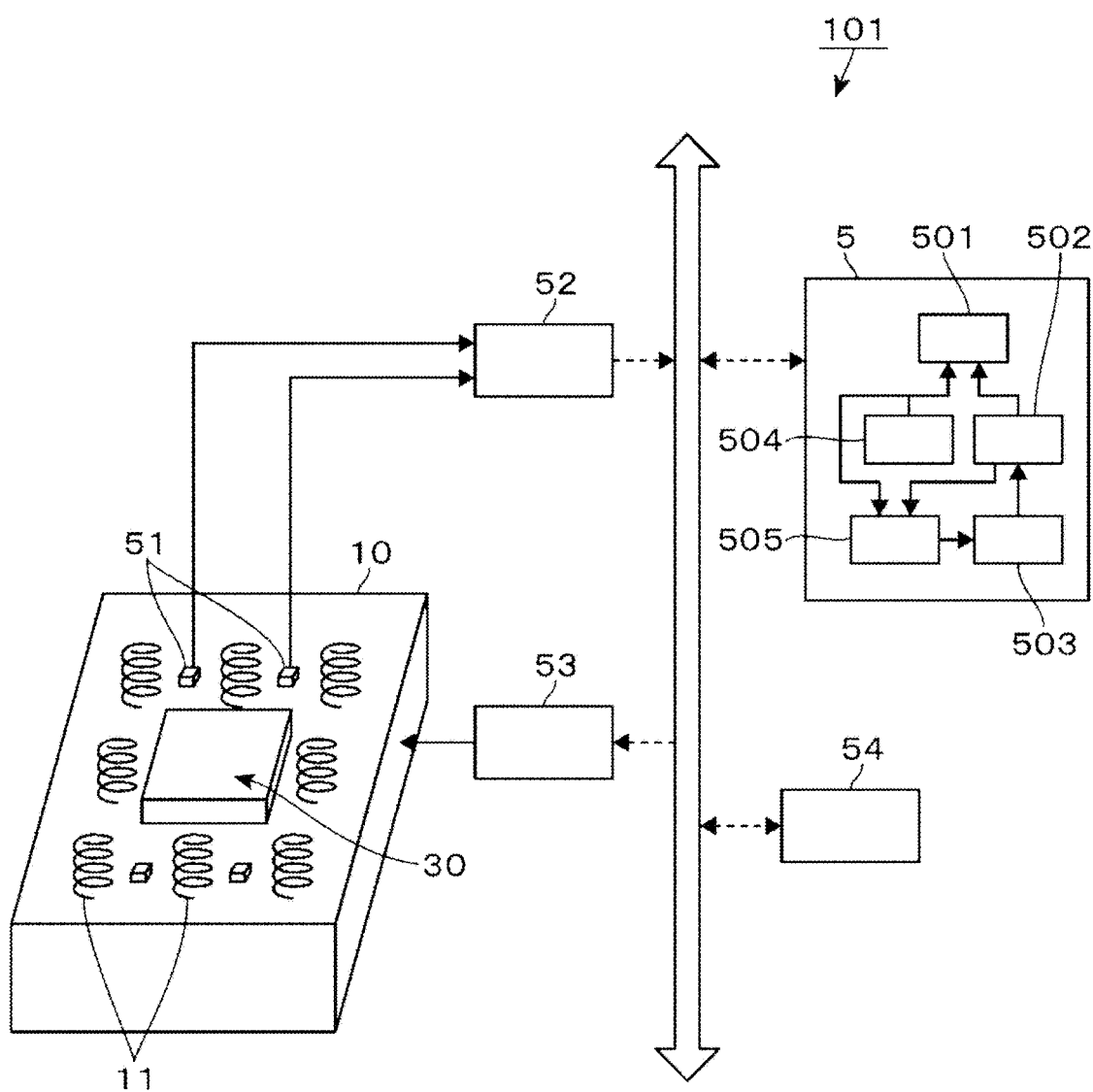
FIG. 4 is a block diagram according to the configuration example of the wafer processing system.

FIG. 4 is a block diagram showing an electrical configuration according to a movement control of the transfer module 30. Regarding movement control of the transfer module 30 using feedback control, the controller 5 includes a parameter storage 503, a control schedule creating section 502, and a magnetic force adjusting section 501.

The parameter storage 503 stores a model parameter for expressing a relationship between a force applied to the transfer module 30 holding the object to be transferred and a movement of the transfer module 30.

This model parameter is stored in associated with each of a plurality of types of objects to be transferred including the normal wafer W. Examples of objects to be transferred other than the normal wafer W include parts used in the wafer processing chamber 110 and the vacuum transfer chamber 160, a damaged wafer W, a failed transfer module 30, and various sensors. A specific example of the part is a focus ring 114 disposed on the placing table 112 in the wafer processing chamber 110 in which the wafer W is processed using a plasmatized processing gas. Further, as an example of the sensor, there is a camera-mounted wafer in which a camera is mounted on a disk having approximately the same diameter as the wafer W.

<Model Parameter>

In the wafer processing system 101 of the present example, the model parameter is determined based on a control model in which the object to be transferred and the transfer module 30 are integrated. Specific examples of the control model and the model parameter will be described below with reference to FIGS. 5A and 5B.

Figure 5A:
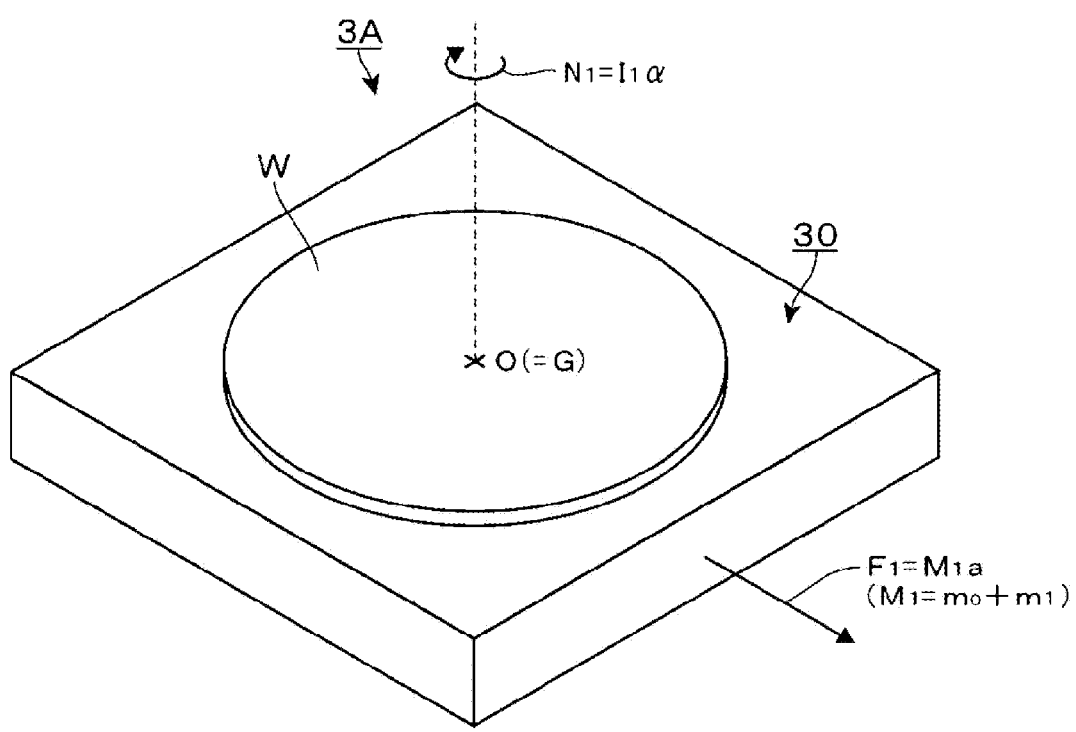
FIG. 5A is a perspective view according to a first configuration example of a control model.

FIG. 5A is an external perspective view of the transfer module 30 that transfers the normal wafer W as the object to be transferred. It is assumed that the mass of the transfer module 30 is $m_0$ and the mass of the wafer W is $m_1$, and a force $F_1$ is applied in the direction of the arrow shown in FIG. 5A. As a result, when the transfer module 30 that transfers the wafer W moves linearly, a theoretical formula that expresses the relationship between the force $F_1$ and acceleration a is given by the following Formula (1).

$$F_1 = (m_0 + m_1)a \quad (1)$$

Here, when the wafer W and the transfer module 30 are regarded as an integrated control model 3A and their total mass is $M_1$ ($=m_0+m_1$), Formula (1) can be rewritten as the following Formula (1)'.

$$F_1 = M_1 a \quad (1)'$$

Formula (1)' expresses the relationship between the force applied to the control model 3A in which the wafer W and the transfer module 30 are integrated and a linear movement of the control model 3A. At this time, the mass $M_1$ of the control model 3A corresponds to the model parameter for expressing the relationship between the force applied to perform the linear movement and the acceleration.

Next, a rotational force $N_1$ is applied to the control model so that it rotates clockwise around the rotation center O indicated by the dashed line in FIG. 5A. Here, the wafer W is held by the transfer module 30 so that the center position of the transfer module 30 having a substantially square planar shape and the center position of the wafer W overlap. The rotation center O in the present example is set so as to pass through the center positions of the wafer W and the transfer module 30. Further, when the influence of a notch and an orientation flat formed on the wafer W and the influence of the slits 341 of the transfer module 30 described with reference to FIG. 2 can be ignored, the rotation center O passes through the center of gravity G of the control model 3A.

When the control model 3A shown in FIG. 5A rotates, a theoretical formula expressing the relationship between the rotational force $N_1$ and the angular acceleration a is represented by the following Formula (2).

$$N_1 = I_1 \alpha \quad (2)$$

Here, $I_1$ is the moment of inertia of the control model 3A, which is determined according to the mass $M_1$ and the shape of the control model 3A, the position of the center of gravity G, and the position of the rotation center O.

Formula (2) expresses the relationship between the rotational force applied to the control model 3A and a rotational movement of the control model 3A. At this time, the moment of inertia $I_1$ corresponds to the model parameter for expressing the relationship between the rotational force applied to perform the rotational movement and the angular acceleration. The rotation center O may be outside the control model 3A. In this case, the control model 3A makes a circular movement rotating around the rotation center O.

Figure 5B:
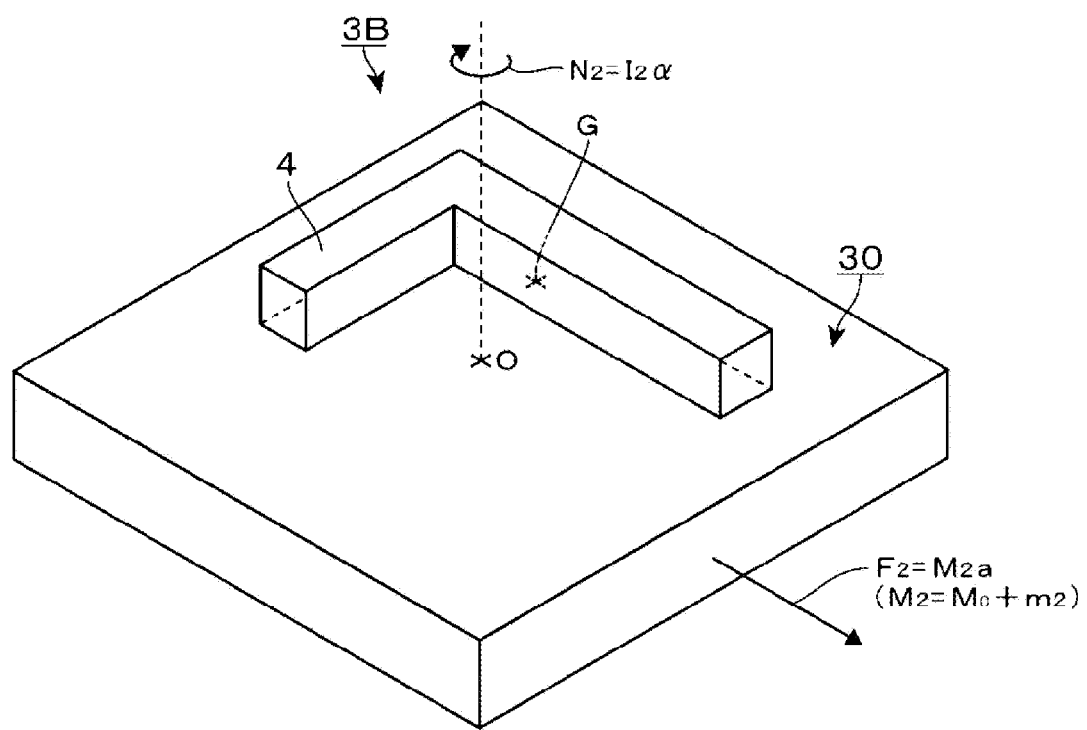
FIG. 5B is a perspective view according to a second configuration example of the control model.

Next, FIG. 5B is an external perspective view of the transfer module 30 that transfers an object to be transferred 4 which is an L-shaped member as the object to be transferred. When the mass of the object to be transferred 4 is $m_2$, a force $F_2$ is applied in the direction of the arrow shown in FIG. 5B. As a result, when the transfer module 30 that transfers the object to be transferred 4 moves linearly, the relationship between the force $F_2$ and the acceleration a is represented by the following Formula (3).

$$F_2 = (m_0 + m_2)a \quad (3)$$

Here, assuming that the object to be transferred 4 and the transfer module 30 are integrated and their total mass is $M_2$ ($= m_0 + m_2$), Formula (3) can be rewritten as the following Formula (3)'.

$$F_2 = M_2 a \quad (3)'$$

Formula (3)' expresses the relationship between the force applied to a control model 3B in which the object to be transferred 4 and the transfer module 30 are integrated and the linear movement of the control model 3B. At this time, the mass $M_2$ of the control model 3B corresponds to the model parameter for expressing the relationship between the force applied to perform the linear movement and the acceleration.

Next, a rotational force $N_2$ is applied to the control model 3B so that it rotates clockwise around the rotation center O indicated by the dashed line in FIG. 5B. Here, the object to be transferred 4 is held at a preset position on the transfer module 30 in a preset posture. Further, the rotation center O is set so as to pass through the center position of the transfer module 30. In this example, the rotation center O passes through a position deviated from the center of gravity G of the control model 3B.

When the control model shown in FIG. 5B rotates, a theoretical formula expressing the relationship between the rotational force $N_2$ and the angular acceleration a is represented by the following Formula (4).

$$N_2 = I_2 \alpha \quad (4)$$

Here, $I_2$ is the moment of inertia of the control model 3B, which is determined according to the mass $M_2$ and the shape of the control model 3B, the position of the center of gravity G, and the position of the rotation center O.

Formula (4) expresses the relationship between the rotational force applied to the control model 3B and the rotational movement of the control model 3B. At this time, the moment of inertia 12 corresponds to the model parameter for expressing the relationship between the rotational force applied to perform the rotational movement and the angular acceleration. The rotation center O may be outside the control model 3B, similarly to the control model 3A in FIG. 5A.

As exemplified above, the model parameters are determined according to the control models 3A and 3B in which the object to be transferred and the transfer module 30 are integrated, and are set in association with each of a plurality of types of objects to be transferred. Further, the model parameters are set according to the type of movement, such as a linear movement and a rotational movement. The model parameters for this state are also set for the transfer module 30 that is not transferring the object to be transferred.

<Control Schedule Creating Section 502>

The control schedule creating section 502 has a function of outputting a "control schedule" representing an operating force to be applied when moving the transfer module 30 holding the object to be transferred along the time axis, based on a preset "movement schedule."

In the wafer processing system 101, when the carrier C is placed on the load port 141, a transfer schedule for each wafer W accommodated in the carrier C is created. In the transfer schedule, information that defines along the time axis when and to which wafer processing chamber 110 each wafer W taken out of the carrier C is to be transferred and when the wafer W, for which processing has been completed, is to be unloaded from the wafer processing chamber 110 and transferred to the carrier C is set.

The transfer schedule is created based on, for example, a processing recipe that defines details of the processing to be performed on each wafer W in the carrier C (processing variables: temperature of heating the wafer W, pressure in the wafer processing chamber 110, supply time of processing gas, processing time, and the like). The processing variables are set via an interface 54. The interface 54 is composed of, for example, a touch panel operated by an operator.

When the transfer schedule is created, for example, a movement schedule that defines the movements (motions) of the plurality of transfer modules 30 disposed in the vacuum transfer chamber 160 in FIG. 1 is created. In the movement schedule, information that defines along the time axis when and where each transfer module 30 receives the wafer W and by when and to where the received wafer W is transferred, and movement paths of the transfer modules 30 are set.

For objects to be transferred other than the normal wafer W, information that defines along the time axis when and where each object to be transferred is to be received and by when and to where it is to be transferred is set.

The transfer schedule and the movement schedule described above are created by the controller 5, for example. Further, a configuration in which a movement schedule created outside is acquired through communication may be adopted.

The control schedule creating section 502 acquires identification information for identifying the object to be transferred by the transfer module 30 and the movement schedule described above. The identification information is set via the interface 54, for example. Then, the control schedule creating section 502 reads the model parameter of the object to be transferred corresponding to the identification information stored in the parameter storage 503. After that, using the parameter, the operating force to be applied when the transfer module 30 holding the object to be transferred corresponding to the identification information is moved based on the movement schedule is obtained, and the control schedule representing the operating force along the time axis is output. The identification information can also identify a state in which "the object to be transferred is not being transferred."

Figure 6:
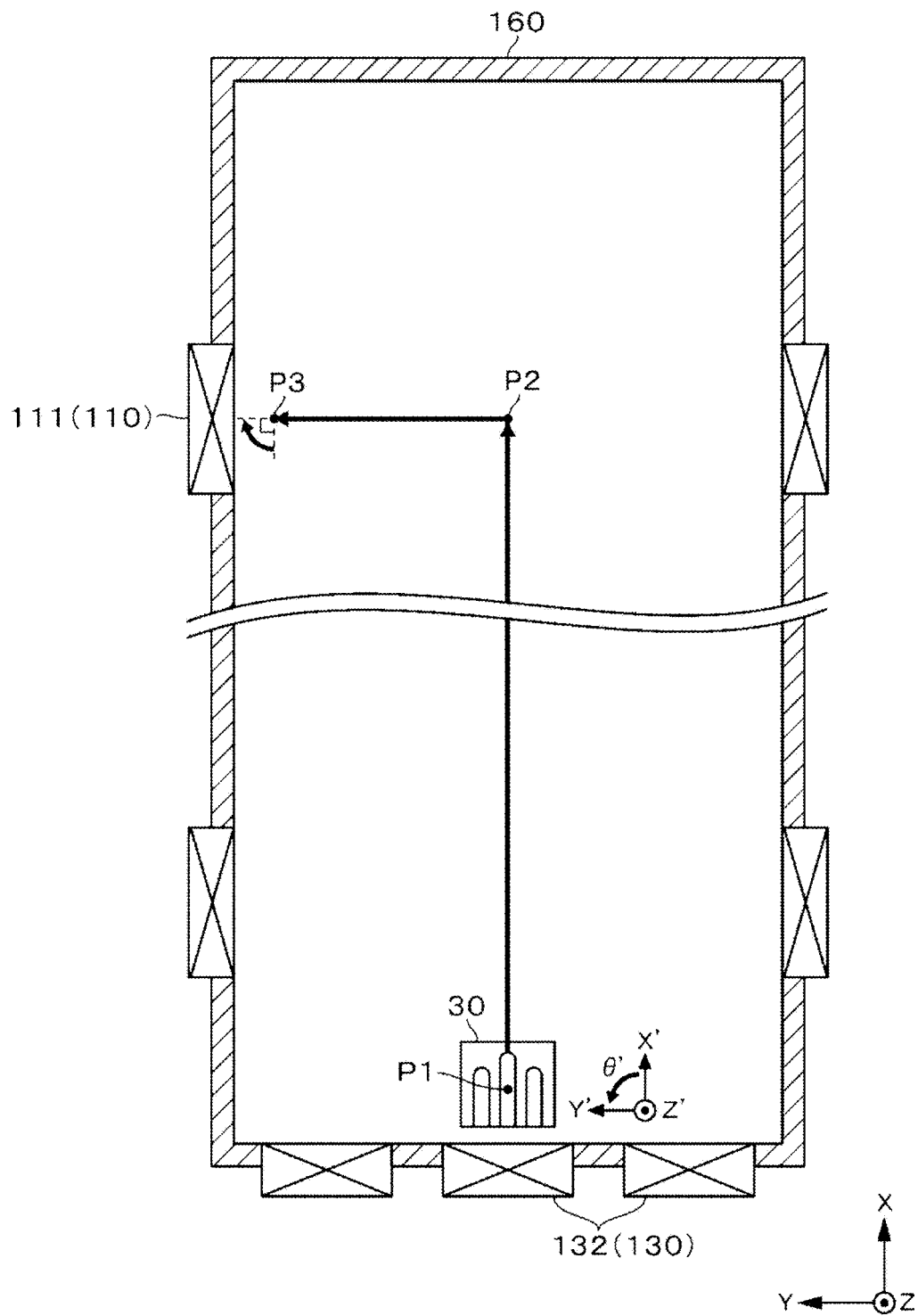
FIG. 6 is a plan view showing an example of a movement of the transfer module.

To give a simplified example, FIG. 6 shows an example of the movement of the transfer module 30 that is performed based on the movement schedule. The transfer module 30 linearly moves from a point P1 outside the load lock chamber 130 to the inner side of the vacuum transfer chamber 160 (in an X' direction of a sub-coordinate set for the transfer module 30). Next, the transfer module 30 changes its moving direction at a point P2 and linearly moves to the left (in a Y' direction of the sub-coordinate) as viewed from the front side until it reaches a point P3. After that, the transfer module 30 is set to rotate clockwise by 90°. The sub-coordinate sets a counterclockwise θ direction as a positive rotation direction.

In order to perform the movement illustrated in FIG. 6 during a predetermined period (for example, a period of time $T_0$ to $T_9$ shown in FIG. 7), the movement speed and rotation speed of the linear movement (linear motion) of the transfer module 30 along the time axis are set in the movement schedule. Here, (a) and (c) of FIG. 7 show the movement speeds $V_{X'}$ and $V_{Y'}$ of the transfer module 30 in the X' and the Y' directions, and (e) of FIG. 7 shows the rotation speed we in the θ direction.

The control schedule creating section 502 reads the model parameters stored in the parameter storage 503 based on the identification information indicating the object to be transferred acquired together with the movement schedule. When the object to be transferred identified by the identification information is the wafer W shown in FIG. 5A, the model parameters $M_1$ and $I_1$ are read for the linear movements from the point P1 to the point P2 and from the point P2 to the point P3, and the rotational movement at the point P3.

Then, using the model parameter $M_1$, the operating force to be applied to the control model 3A (the transfer module 30 holding the wafer W) in which the wafer W and the transfer module 30 are integrated is obtained. That is, for the linear movement from the point P1 to the point P2 (period of time $T_0$ to $T_3$ in FIG. 7), from the movement speed $V_{X'}$ of the transfer module 30 in the X' direction at each time shown in (a) of FIG. 7, the acceleration $a_{X'}$ in the same direction at each time is obtained ((b) of FIG. 7). Then, by substituting the acceleration $a_{X'}$ at each time and the model parameter $M_1$ into the above-described Formula (1)', the control schedule representing the operating force to be applied to the transfer module 30 along the time axis is obtained.

Figure 7:
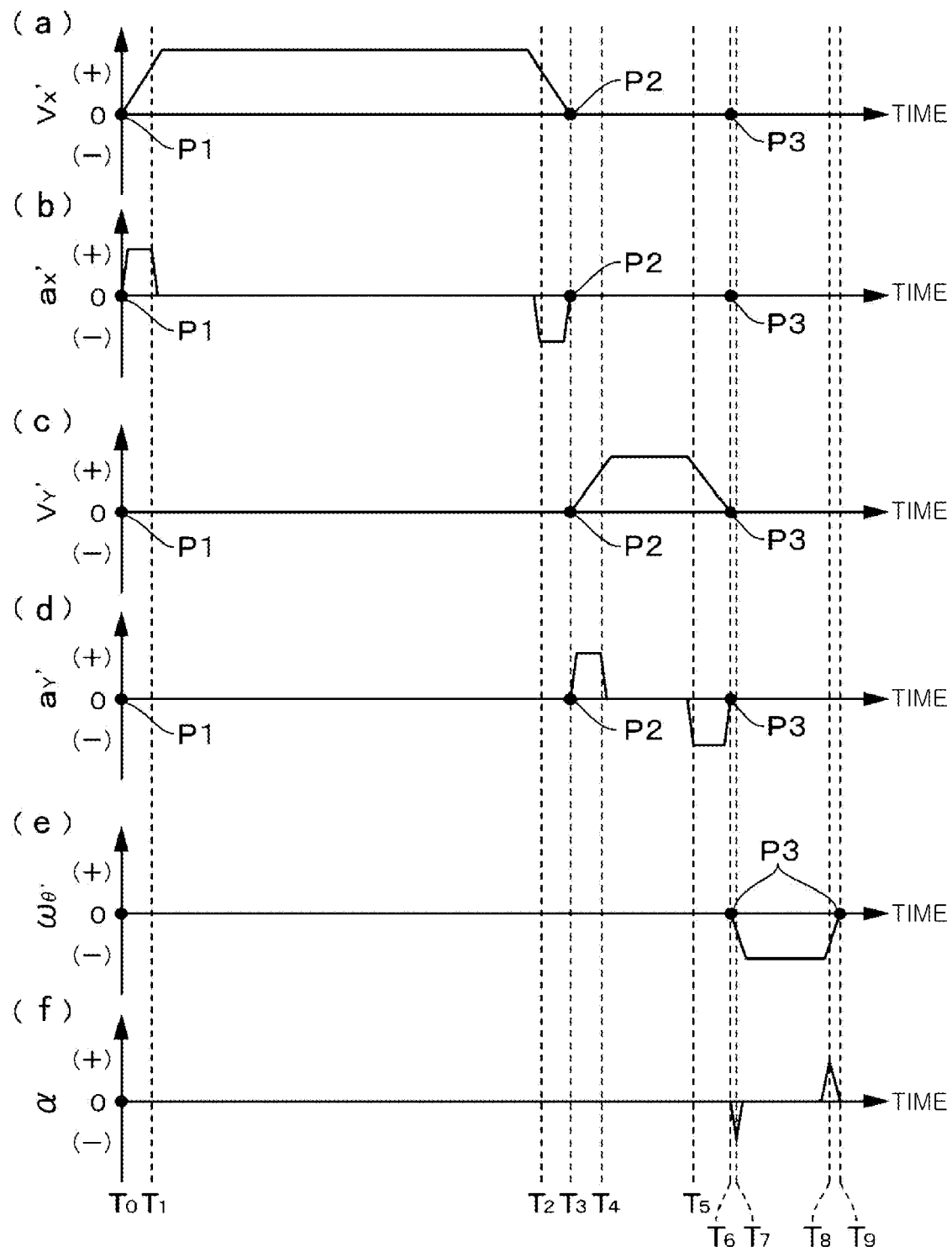
FIG. 7 is an example of a time chart according to feedforward control.

Here, the acceleration $a_{X'}$ at each time shown in (b) of FIG. 7 may be created by the control schedule creating section 502 that acquires the movement schedule in (a) of FIG. 7. Alternatively, the acceleration $a_{X'}$ at each time shown in (b) of FIG. 7 may be externally acquired as "the movement schedule defining the movement of the transfer module 30" (the same applies to (d) and (f) of FIG. 7 described later).

Similarly, in the linear movement from the point P2 to the point P3 (period of time $T_3$ to $T_6$ in FIG. 7) and the rotation at the point P3 (period of time $T_0$ to $T_9$ in FIG. 7), from changes in speed in the Y' direction and the θ direction in (c) and (e) of FIG. 7, the accelerations in the same directions at each time are obtained ((d) and (f) of FIG. 7).

For the linear movement from the point P2 to the point P3, the control schedule is obtained by substituting the acceleration $a_{Y'}$ at each time in (d) of FIG. 7 and the model parameter $M_1$ into Formula (1)'. Further, for the rotation at the point P3, the control schedule is obtained by substituting the acceleration a at each time in (f) of FIG. 7 and the model parameter $I_1$ into Formula (2).

On the other hand, when the object to be transferred identified by the identification information is the object to be transferred 4 shown in FIG. 5B, the model parameters $M_2$ and $I_2$ are read from the parameter storage 503. Then, using the Formulas (3)' and (4) described above, the control schedule for the control model 3B (the transfer module 30 holding the object to be transferred 4) is obtained in the same manner as for the control model 3A.

<Magnetic Force Adjusting Section 501>

The control schedule creating section 502 outputs the created control schedule to the magnetic force adjusting section 501. The magnetic force adjusting section 501 controls the magnetic force of the moving surface side coils 11 so that the operating force based on the control schedule is applied to the transfer module 30 (which is transferring the object to be transferred) shown in FIG. 6. That is, the magnetic force adjusting section 501 outputs a control signal to the power supply 53 shown in FIG. 4 for selecting the moving surface side coil 11 to which power is to be supplied and for adjusting the magnitude of power supplied to the selected moving surface side coil 11.

Based on the control signal acquired from the magnetic force adjusting section 501, the power supply 53 selects the moving surface side coil 11 to which power is to be supplied, and adjusts the magnitude of power supplied to the selected moving surface side coil 11. As a result, based on the movement schedules shown in (a), (c), and (e) of FIG. 7, the FF control is performed so that the transfer module 30 moves along the movement path shown in FIG. 6 and changes its posture.

Here, the movement of the transfer module 30 may be not only the simple movement illustrated in FIG. 6, but also a complicated movement involving a curvilinear movement or the like. By combining the movements in the X' and Y' directions and the rotation and circular movement in the θ direction shown in each of FIG. 7, the control schedule for more complicated movement can be created. Further, when the transfer module 30 is configured to enter areas other than the vacuum transfer chamber 160, such as the wafer processing chamber 110 and the load lock chamber 130, the movement schedule and the control schedule are created that include movements in these areas.

As described above, the wafer processing system 101 of the present example creates the control schedule based on the model parameters set using different control models depending on the objects to be transferred and the movement schedule. By performing the FF control of the transfer module 30 based on this control schedule, it is possible to achieve control with little delay even in the case of transferring different types of objects to be transferred.

<Feedback Correction Section 504>

On the other hand, when controlling the movement of the transfer module 30, there is a risk of receiving various unpredictable disturbances. For example, vibration caused by movement of people or heavy objects around the wafer processing system 101 or occurrence of an earthquake causes a deviation between the movement schedule and the actual movement of the transfer module 30.

Further, the moving surface side coils 11 arranged in large numbers on the tile 10 as shown in FIG. 3 may differ in winding state of the moving surface side coils 11 within the range of tolerance. Further, each moving surface side coil 11 in the tile 10 and each module side magnet 33 in the transfer module 30 may also be shifted within the range of tolerance. Due to these equipment factors, the operating force applied to the transfer module 30 may change depending on the position of the tile 10 even if the same amount of power is supplied.

Further, for the object to be transferred whose shape cannot be uniquely specified in advance, such as the damaged wafer W, the control model is set under rough assumptions such as "a case where a part of the wafer W is missing" and "a case where the wafer W is curved." Therefore, the model parameters corresponding to this control model may not accurately express the actual movement of the transfer module 30.

In this way, when a disturbance is received, when the operating force changes depending on the position, or when highly accurate model parameters cannot be obtained, if only FF control is performed, there is also a risk that the transfer module 30 does not reach a correct position within a predetermined period of time. Therefore, the controller 5 shown in FIG. 4 has a feedback (FB) correction section 504 for complementing the above-described FF control and performing more accurate movement control.

In order to detect the position and posture of the transfer module 30 used by the FB correction section 504, sensors 51 are provided in the vacuum transfer chamber 160. The position and posture detector 52 identifies the position and the posture of the transfer module 30 based on information acquired from the sensor 51.

Examples of the sensors 51 include a plurality of Hall sensors provided at preset positions in the tile 10, a laser displacement meter, and a camera for imaging the transfer module 30. FIG. 4 shows an example in which a plurality of Hall sensors are provided on the tile 10 as the sensors 51.

The FB correction section 504 compares the position or posture of the transfer module 30 defined in the movement schedule with the actual position or posture of the transfer module 30 detected by the sensors 51. Then, the adjustment of the magnetic force of the moving surface side coils 11 by the magnetic force adjusting section 501 is corrected so that the amount of deviation of the position or posture becomes small.

That is, the FB correction section 504 outputs a correction signal for correcting timing of selecting the moving surface side coils 11 to which power is to be supplied and the magnitude of the power supplied to the selected moving surface side coils 11 to the magnetic force adjusting section 501. The magnetic force adjusting section 501 adds a correction amount acquired from the FB correction section 504 to the control signal obtained based on the control schedule, and outputs the result to the power supply 53.

<Parameter Update Section 505>

By correcting the FF control using the FB correction section 504, it is possible to suppress a deterioration of control accuracy caused by equipment factors and model parameter factors described above. On the other hand, if a state in which the proportion of the correction amount acquired from the FB correction section 504 is large continues, it becomes difficult to exhibit the original characteristics of the FF control that control with little delay is possible.

Therefore, as shown in FIG. 4, the controller 5 includes a parameter update section 505 for updating the model parameters. The parameter update section 505 has a function of updating the model parameter so that the correction amount of the FB correction section 504 becomes small when a state in which the correction amount exceeds a preset threshold value continues for a preset period.

In an example using the FB correction section 504, the relationship between the operating force for moving the transfer module 30 and the component of the FF control and the component of the correction amount of the FB can be expressed by the following Formula (5).

$$F = F_{FF} + F_{FB} \quad (5)$$

Here, F denotes the operating force applied to the transfer module 30, $F_{FF}$ denotes the component of the FF control by the control schedule creating section 502, and $F_{FB}$ denotes the component of the correction amount of the FB correction section 504. The magnitudes of $F_{FF}$ and $F_{FB}$ can be grasped from the operating force indicated by the control schedule output from the control schedule creating section 502 and the correction amount output from the FB correction section 504.

For example, when a state in which the ratio of the magnitude of $F_{FB}$ to the magnitude of $F_{FF}$ ($|F_{FB}|/|F_{FF}|$) exceeds a preset threshold value continues, the parameter update section 505 updates the model parameters stored in the parameter storage 503. As an example of the threshold value, a case in which the magnitude of $F_{FB}$ exceeds 10% of the magnitude of $F_{FF}$ can be exemplified. This threshold value is not limited to being defined by a ratio to the magnitude of $F_{FF}$. For example, a threshold value may be set for the absolute value of $F_{FB}$.

Further, even when the operating force applied to the transfer module 30 is the rotational force N in Formulas (2) and (4) described above, the degree of influence of the correction amount of the FB can be grasped in the same manner as the above example.

On the other hand, if the model parameters are updated when the state in which the correction amount of the FB correction section 504 exceeds the threshold value continues only for a short period of time, update is frequently performed and thus movement control of the transfer module 30 may become unstable. Accordingly, the parameter update section 505 updates the model parameters when the state in which the correction amount exceeds the preset threshold value continues for a preset period of time.

As an example of the period of time for determining whether the model parameters need to be updated, a case can be exemplified where a state in which the magnitude of $F_{FB}$ exceeds the threshold value continues in the movement control of the entire movement path of the transfer module 30 from the position at which the object to be transferred is received to the position to which the object to be transferred is transferred. Further, the model parameters may be updated when this state is repeated multiple times.

As a method of updating the model parameters, a case of back-calculation from the corrected operating force can be exemplified. Using the example of FIGS. 5A and 5B, based on the operating force actually applied to the transfer module 30 (F in Formula (5)) and Formulas (1)' and (3)', the masses $M_1$ and $M_2$, which are new model parameters of the control models 3A and 3B, are back-calculated. When the back-calculated model parameters $M_1$ and $M_2$ fluctuate over time, their average value may be used as a new model parameter.

A new model parameter can also be obtained by the same method for the model parameters (moments of inertia $I_1$ and $I_2$) in the case of rotating the transfer module 30.

Providing the FB correction section 504 and the parameter update section 505 in the controller 5 shown in FIG. 4 is not an essential requirement. For example, correction by the FB correction section 504 and update of the model parameters may be omitted depending on the accuracy required for the movement control of the transfer module 30.

<Operation of Controller 5>

Figure 8:
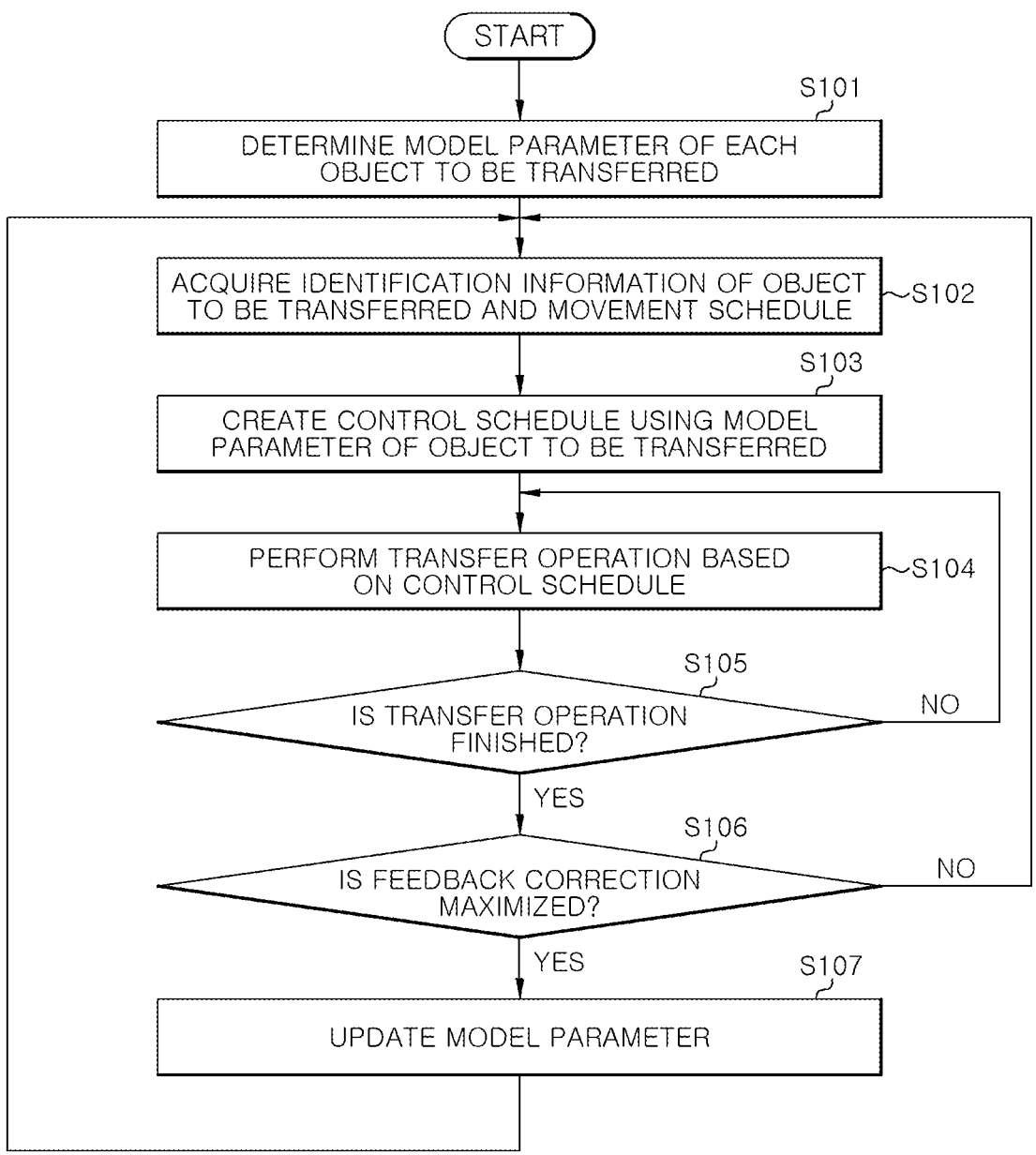
FIG. 8 is an example of a flowchart according to a movement control of the transfer module.

An example of operation of controlling the movement of a certain transfer module 30 using the controller 5 having the configuration described above will be described with reference to a flowchart of FIG. 8.

First, as a preparation (start) before starting the operation of the wafer processing system 101, the model parameter of each object to be transferred is determined and stored in the parameter storage 503 according to details of the transfer module 30 (step S101, a process of determining a parameter).

Next, the wafer processing system 101 is operated, and at the timing of transferring the wafer W or other object to be transferred by the transfer module 30, the identification information on the object to be transferred and the movement schedule are acquired (step S102). After that, the model parameter of the object to be transferred corresponding to the identification information (including a state in which the object to be transferred is not being transferred) is read, and the control schedule is created using the movement schedule and the model parameter and output (step S103, a process of outputting the control schedule).

Based on the created control schedule, the magnetic force adjusting section 501 performs power supply control by the power supply 53 and performs the operation of transferring the object to be transferred by the transfer module 30 (step S104, a process of performing feedforward control). At this time, if the controller 5 includes the FB correction section 504, the sensor 51 detects the position and posture of the transfer module 30 (a process of detecting the position or posture of the transfer module 30). Then, correction is performed so that the amount of deviation of the detection result to the position and posture of the transfer module 30 defined in the movement schedule is reduced (a process of performing feedback correction). If the transfer operation has not finished, this operation is continued (step S105: NO).

If the transfer operation has finished (step S105: YES), since the correction amount of the FB correction section 504 is greater than the threshold value and this state exceeds the preset period of time, it is confirmed whether the model parameter needs to be updated (step S106). If update is not necessary, the operation is finished and the timing for transferring the next object to be transferred is awaited (step S106: NO→step S102).

If the model parameter needs to be updated (step S106: YES), a new model parameter is obtained by the above-described method, the obtained result is input to the parameter storage 503 to update the model parameter (step S107, a process of updating the model parameter), and then the timing for transferring the next object to be transferred is awaited (to step S102).

<Effects>

The wafer processing system 101 of the present disclosure has the following effects. Based on the control model in which the object to be transferred and the transfer module 30 are integrated, a plurality of types of model parameters for expressing the relationship between the operating force applied to the control model and the movement are prepared according to the objects to be transferred. By switching and using these model parameters and creating the control schedule that defines the operating force for moving the transfer module 30 along the time axis, accurate movement control (FF control) can be performed even when transferring objects to be transferred other than the wafer W.

<Wafer Processing System 101a>

Figure 9:
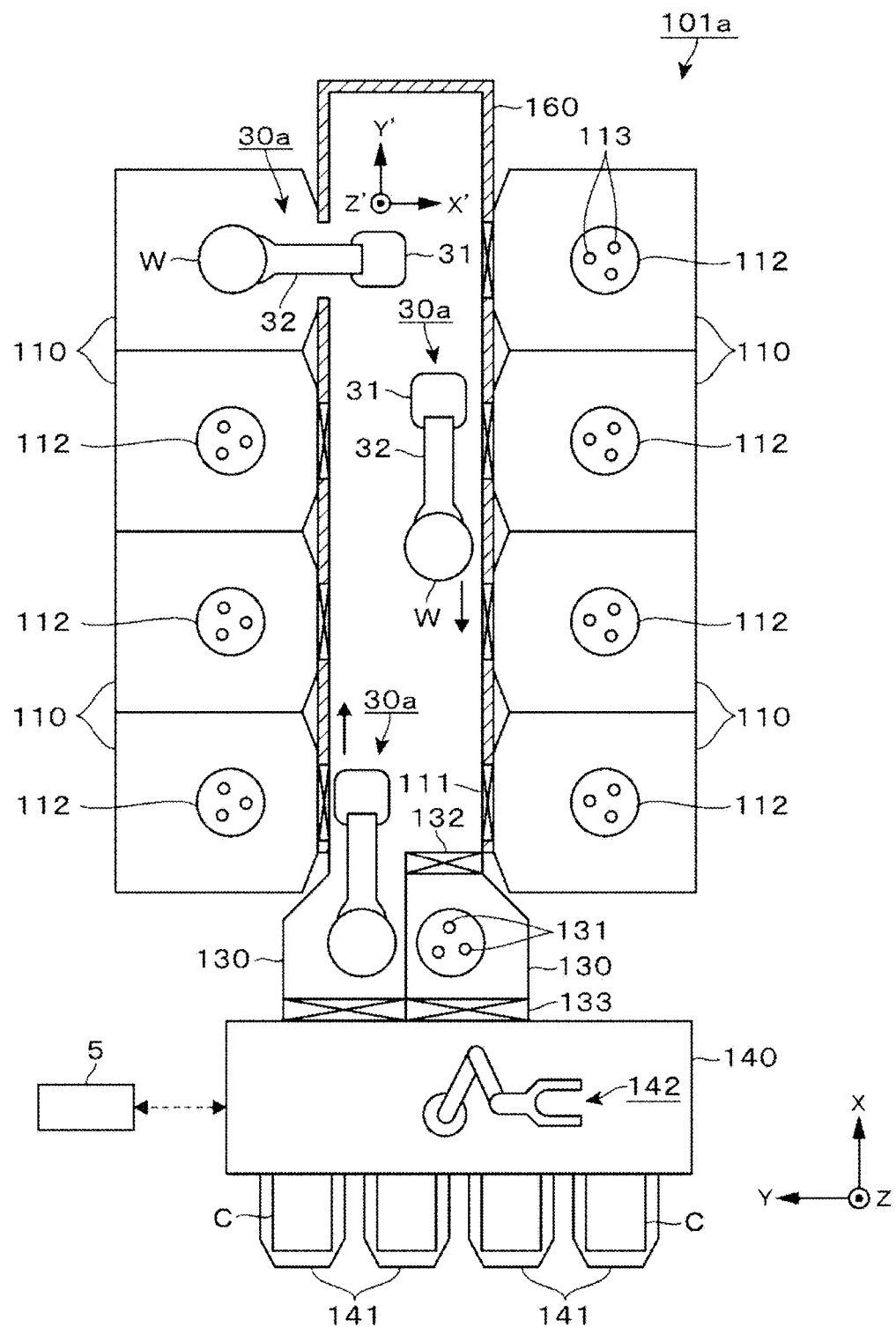
FIG. 9 is a plan view showing a second configuration example of the wafer processing system.
Figure 10:
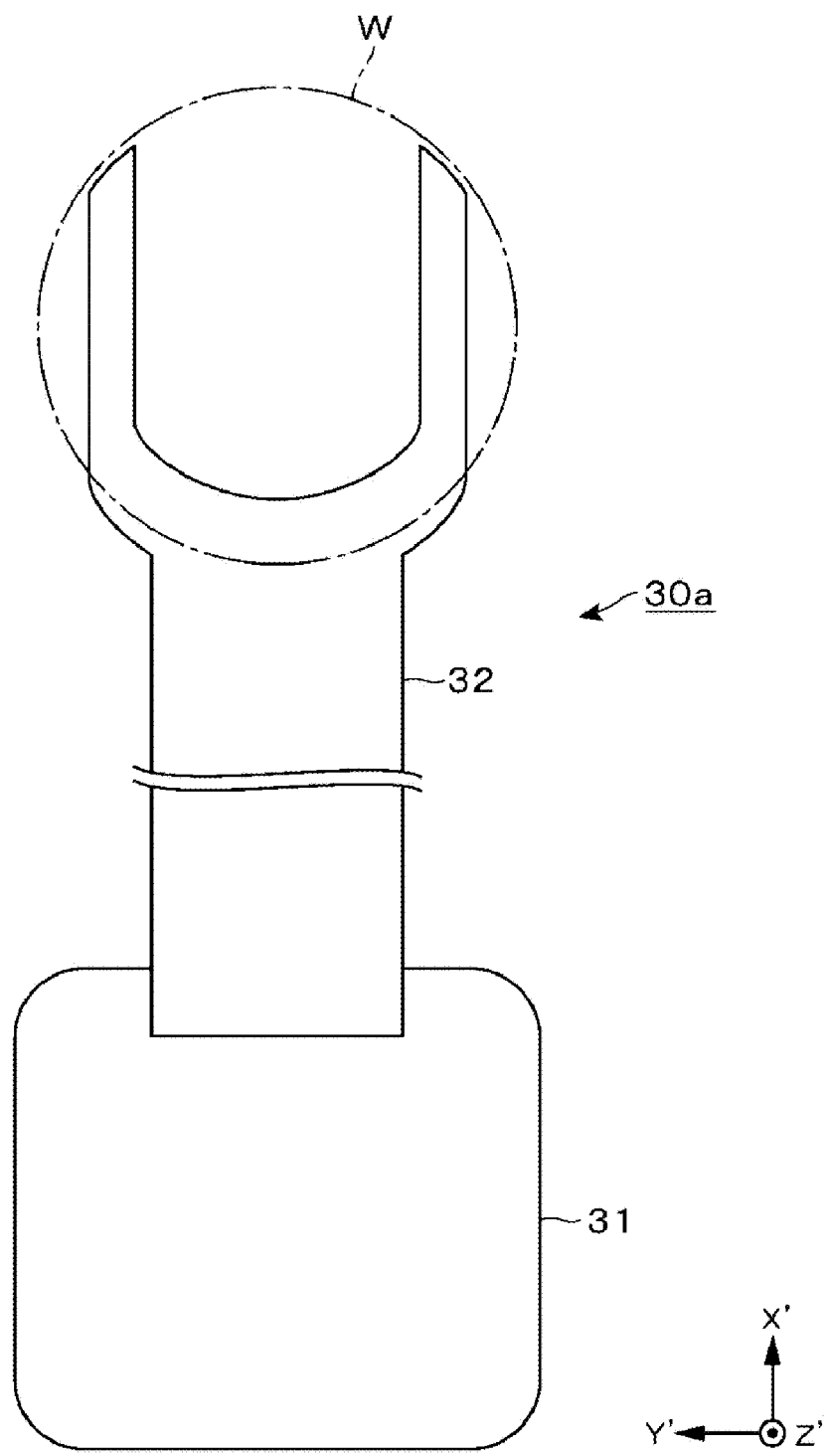
FIG. 10 is a plan view showing a second configuration example of the transfer module.
Figure 11:
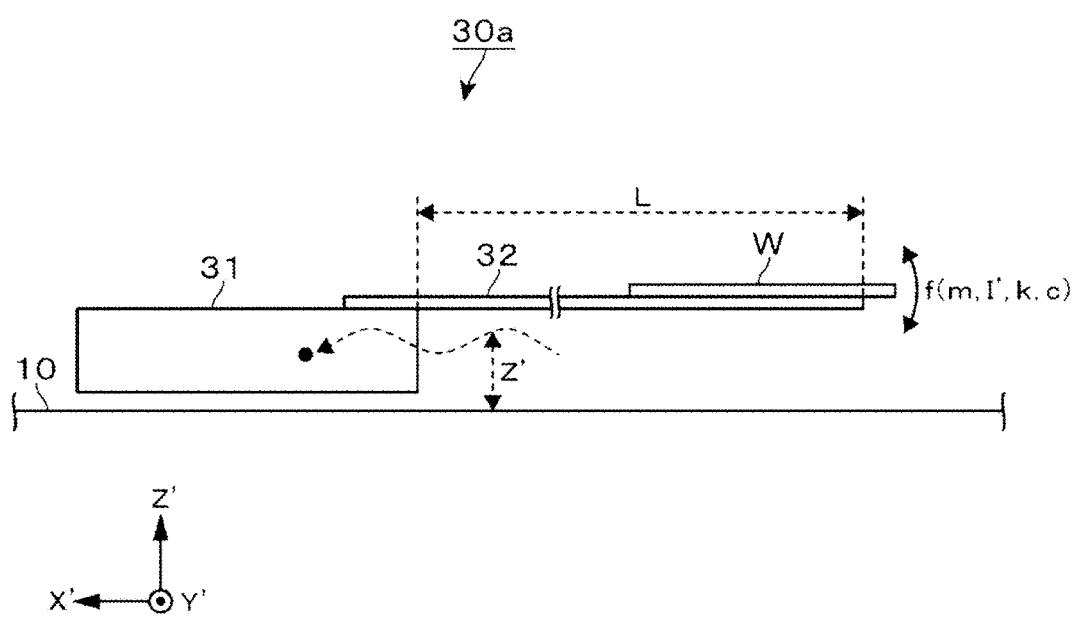
FIG. 11 is a side view according to an example of a transfer operation of the transfer module.

FIGS. 9 to 11 are configuration examples of a wafer processing system 101a that transfers an object to be transferred using a transfer module 30a according to another embodiment. In FIGS. 9 to 13 described below, components common to those of the wafer processing system 101 and the transfer module 30 described with reference to FIGS. 1 to 6 are denoted by common reference numerals.

The wafer processing system 101a shown in FIG. 9 uses the transfer module 30a having an arm 32 to transfer an object to be transferred. In this respect, the transfer module 30a differs from the transfer module 30 according to the first embodiment, in which the upper surface of the main body 31 serves as the stage 34 for holding the object to be transferred. In the transfer module 30a, a configuration of the main body 31 formed in a rectangular shape in plan view is substantially the same as that of the transfer module 30 according to the first embodiment. That is, as in the example shown in FIG. 3, a plurality of module side magnets 33 are provided inside the main body 31. However, the slits 341 are not formed in the main body 31 of the transfer module 30a of the present example.

As shown in FIGS. 10 and 11, the main body 31 is provided with the arm 32 for holding the wafer W horizontally. The arm 32 is provided so as to extend in the horizontal direction from the base end portion on the main body 31 side. A fork which can be arranged to surround from the left and right the area in which the three lifting pins 131 (113) are provided is provided at the tip of the arm 32. The fork corresponds to the holder in the transfer module 30a.

The transfer module 30a transfers the wafer W by inserting the arm 32 into the wafer processing chamber 110 or the load lock chamber 130 while the main body 31 is positioned inside the vacuum transfer chamber 160. Accordingly, a length L of the arm 32 is configured to allow the wafer W held by the arm 32 to enter the position above the lifting pins 113 and 131.

On the other hand, in the example shown in FIG. 9, the length in the short side direction of the vacuum transfer chamber 160, which is rectangular in plan view, is such that two transfer modules 30a each holding the wafer W can pass each other in a state of being laterally aligned. Further, the length in the short side direction of the vacuum transfer chamber 160 in this example is shorter than the length from the main body 31 to the edge of the wafer W on the opposite side of the main body 31 when the transfer module 30a holds the wafer W (entire length of the transfer module 30a holding the wafer W).

Using the transfer module 30a configured as described above, when the wafer W is transferred in the vacuum transfer chamber 160 whose length in the short side direction is shorter than the entire length of the transfer module 30a, the transfer module 30a that has received the wafer W in the load lock chamber 130 performs a retreating movement. When the transfer module 30a is retracted to the side position of the wafer processing chamber 110, the main body 31 passes through the position of the gate valve 111 of the wafer processing chamber 110 and moves to the inner side. By this movement, the tip side of the arm 32 holding the wafer W is disposed on the side of the gate valve 111.

In this way, when the tip side of the arm 32 reaches the side of the gate valve 111, in addition to the retracting movement, the tip side of the arm 32 rotates so as to face the gate valve 111. Subsequently, the gate valve 111 is opened, and the transfer module 30a switches its moving direction to the front while rotating so as to insert the wafer W into the wafer processing chamber 110.

As described above, the length in the short side direction of the vacuum transfer chamber 160 is shorter than the entire length of the transfer module 30a holding the wafer W. Even in this case, the wafer W can be loaded into the wafer processing chamber 110 in the vacuum transfer chamber 160 by switching advance and retract of the transfer module 30a in combination with the rotational movements.

In the above-exemplified movement control of the transfer module 30a as well, there is no change in the operation of the controller 5 that creates the control schedule using the movement schedule and the model parameters. On the other hand, in the transfer module 30a which uses the arm 32 to transfer the object to be transferred, the influence of vibration may increase. If the object to be transferred is transferred while a large vibration is generated, the holding position on the arm 32 may shift, the object to be transferred may fall, or the object to be transferred may come into contact with other equipment.

Accordingly, in the wafer processing system 101a of the present example, when the arm 32, which is the holder, is regarded as a leaf spring, the mass m of the object to be transferred, the moment of inertia I' of the transfer module 30a holding the object to be transferred, the spring constant k, and the damping coefficient c are stored in the parameter storage 503 as model parameters for expressing vibrations generated in the arm 32.

It is assumed that the vibration f of the arm 32 can be expressed as a function f(m, I', k, c) of these model parameters by a theoretical formula expressing the natural frequency of the arm 32. In order to dampen this vibration, when the transfer module 30a shown in FIG. 11 is moved in the X' direction, vibration suppressing control may be performed by vertically moving the transfer module 30a so as to draw a trajectory whose frequency is the same as that of the vibration f and whose phase is reversed from that of the vibration f (see the dashed arrow in FIG. 11). Further, a notch filter may be provided in a feedback loop to reduce the vibration f corresponding to the natural frequency of the arm 32.

Further, even when it is difficult to specify the vibration f by a theoretical formula, the model parameters may be determined by machine learning. For example, model parameters A, ω, and θ may be determined by, for example, machine learning using a neural network by expressing the vibration f using the following Formula (6) and repeating the operation of transferring the object to be transferred without performing vibration suppressing control multiple times.

$$f = A \sin(\omega t + \theta) \quad (6)$$

Here, A is the amplitude, ω is the angular velocity, and θ is the initial phase.

Further, machine learning such as a neural network may be performed not only when the model parameters are determined, but also when the model parameters are updated by the parameter update section 505. For example, it is assumed that a vibration sensor, which is a sensor, is provided in the main body 31, and the frequency and phase of vibration suppressing control are corrected so that the amplitude of vibration detected by this vibration sensor is reduced.

At this time, when a state in which the correction amount of the FB correction section 504 exceeds a preset threshold value continues for a preset period, for example, the model parameters A, ω, and θ in Formula (6) may be updated. At this time, the vertical movement of the transfer module 30 for vibration suppressing control can be grasped based on the corrected control signal output from the magnetic force adjusting section 501. New model parameters may be determined by learning this vertical movement by machine learning and obtaining Formula (6).

In the above description, the model parameters of the control model are determined and updated based on a theoretical formula representing a relationship with the movement of the control model, and by machine learning.

In addition to these, it is also possible to formulate a state equation that includes model parameters and represents details of the FF control and the FB correction of the transfer modules 30 and 30a, and further formulate an observer that estimates the internal state of this control system. Based on the result of estimation of the internal state of the control system by the observer, model parameters can be determined and updated.

Figure 12:
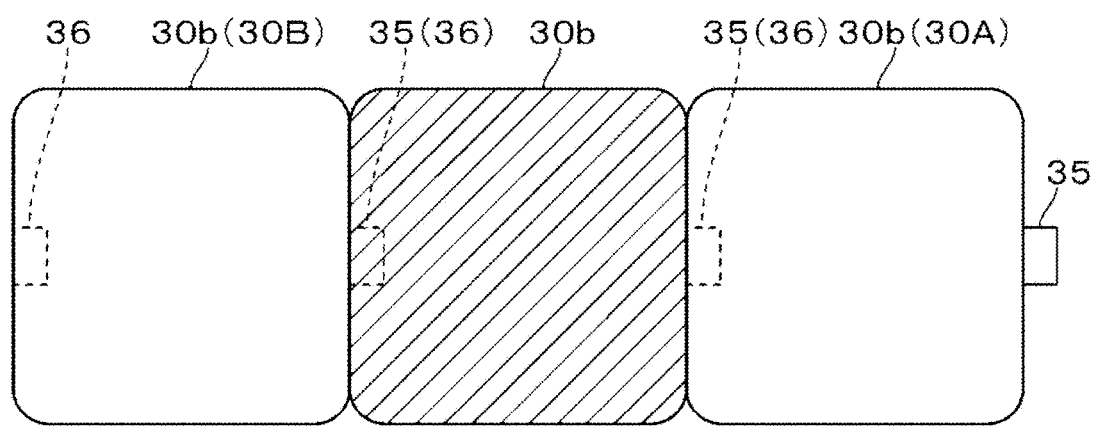
FIG. 12 is a schematic diagram showing an example of the transfer operation of the transfer module that has failed.
Figure 12:
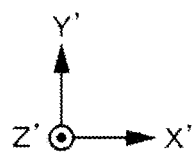
Figure 13:
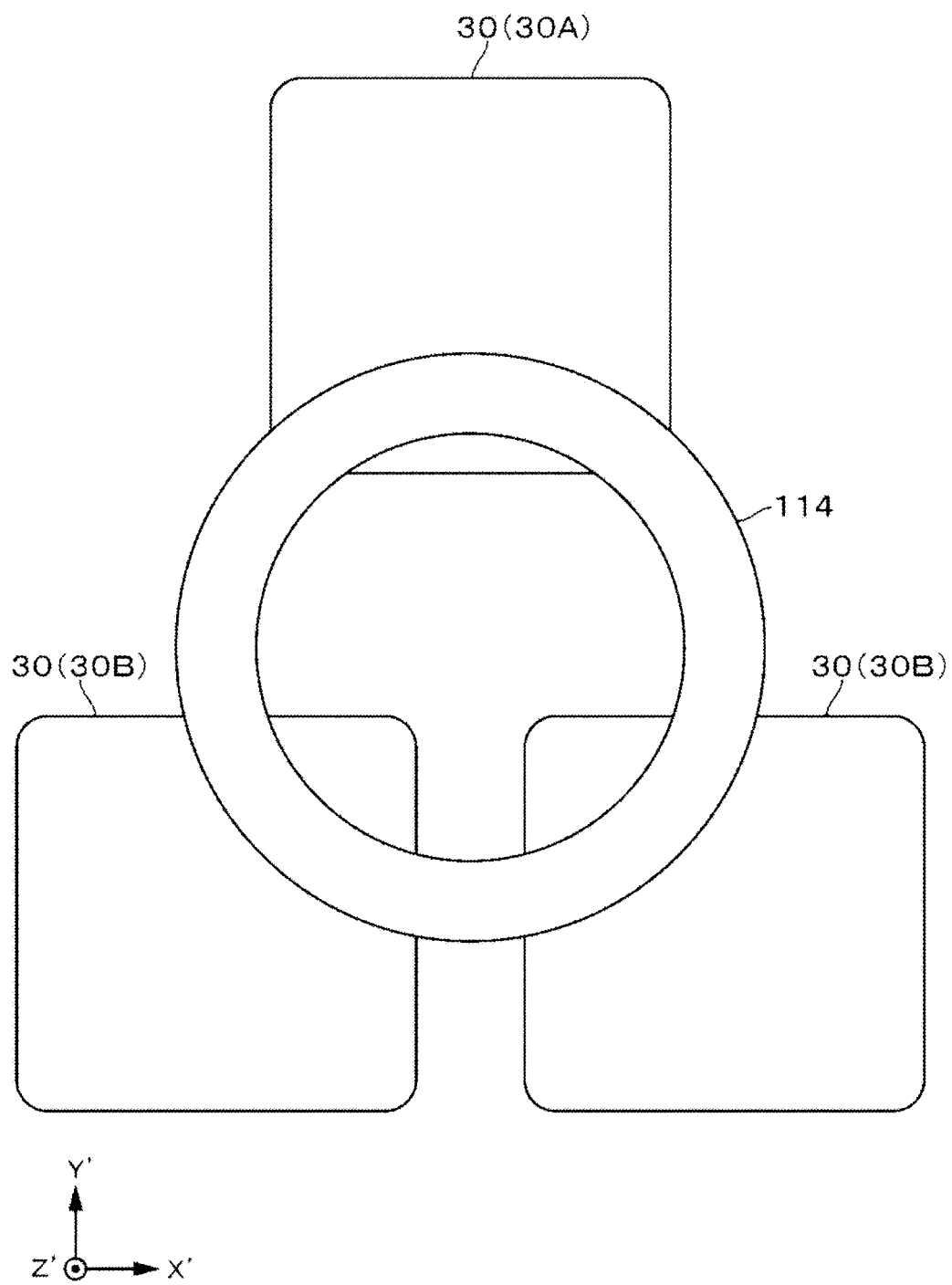
FIG. 13 is a schematic diagram showing an example of the transfer operation of a part.

FIGS. 12 and 13 show an example in which a plurality of transfer modules 30 transfer an object to be transferred in cooperation.

First, in FIG. 12, the object to be transferred is a failed transfer module 30b and the failed transfer module 30b is transferred by two other transfer modules 30b. In the figure, the failed transfer module 30b is hatched with oblique lines.

In this example, a protrusion 35 is provided on the side surface of each transfer module 30b. A recess 36 into which the protrusion 35 can be inserted is provided on the side surface opposite to the surface on which the protrusion 35 is provided. As shown in FIG. 12, a plurality of transfer modules 30b can be connected by inserting the protrusion 35 of one transfer module 30b into the recess 36 of other transfer module 30b.

As described above, by configuring the plurality of transfer modules 30b to be connectable, for example, when one transfer module 30b fails and becomes immovable, the plurality of transfer modules 30b can be connected so that the failed transfer module 30b is sandwiched between other transfer modules 30b. The failed transfer module 30b is held and transferred by the other transfer modules 30b.

For the transfer modules 30b exemplified above, the model parameters are determined in advance based on the control model in which the failed transfer module 30b is the object to be transferred. Then, the control schedule is created using these model parameters and the movement schedule, and the movement control is performed. This operation is the same as that in the examples described with reference to FIGS. 1 to 11.

On the other hand, if the two transfer modules 30b that cooperate to transfer the failed transfer module 30b are independently controlled in movement, there may be a deviation in the movement control. If there is a deviation in movement control, there is a risk that the gap between the two transfer modules 30b is widen and the failed transfer module 30b fall. Accordingly, the transfer module 30a of the present example uses one transfer module 30b as a master device 30A and performs the FF control described above on this master device 30A. On the other hand, the other transfer module 30b is used as a slave device 30B, and the magnetic force of the moving surface side coils 11 is adjusted so that an operating force causing the slave device 30B to move following the master device 30A is applied to the slave device 30B. By performing master-slave control in this way, it is possible to prevent the object to be transferred from falling due to a deviation in control.

Further, the plurality of transfer modules 30 may cooperate to transfer components disposed in the vacuum transfer chamber 160 or the wafer processing chamber 110 as objects to be transferred. In addition, the plurality of transfer modules 30 may be configured to cooperate to transfer components in the load lock chamber 130.

FIG. 13 shows how three transfer modules 30 cooperate to transfer the focus ring 114 provided on the placing table 112 of the wafer processing chamber 110.

When three or more transfer modules 30 cooperate as well, one master device 30A and the other slave devices 30B are set. Then, the movement control based on the control schedule created using the model parameters and the movement schedule is performed on the master device 30A. By causing the other slave devices 30B to follow the master device 30A, accurate movement control can be performed while preventing the objects to be transferred from falling.

Here, the configuration example of the apparatus in which the transfer module 30 transfers the object to be transferred is not limited to the example of the vacuum transfer chamber 160 described above. For example, the control method of the present example can also be applied to a case where the wafer W is transferred under the atmospheric pressure atmosphere and the wafer W is processed under the atmospheric pressure atmosphere. Examples of the processing performed under the atmospheric pressure atmosphere include, for example, coating and developing processing in which the wafer W is coated with a resist liquid for exposure and a developing liquid, and cleaning processing in which the substrate is cleaned with a cleaning liquid.

It should be considered that the embodiments disclosed this time are illustrative in all respects and not restrictive. The embodiments described above may be omitted, substituted, or modified in various ways without departing from the scope and spirit of the appended claims.

What is claimed is:

1. An apparatus for transferring a substrate to a substrate processing chamber, the apparatus comprising:
   a substrate transfer chamber having a floor provided with first magnets and a side wall connected to the substrate processing chamber and formed with an opening through which the substrate is loaded into and unloaded from the substrate processing chamber;
   a substrate transfer module comprising a holder configured to hold each of a plurality of types of objects to be transferred, which are the substrate or equipment used in the substrate transfer chamber or the substrate processing chamber, and second magnets having a repulsive force acting on the first magnets, the substrate transfer module being configured to be movable in the substrate transfer chamber by magnetic levitation using the repulsive force; and
   a controller configured to control an operating force for moving the substrate transfer module using feedforward control by adjusting a magnetic force of the first magnets to change the repulsive force,
   wherein the controller comprises:
   a parameter storage configured to store at least one model parameter for expressing a relationship between an operating force applied to a control model in which the object to be transferred and the substrate transfer module are integrated and a movement of the control model, said at least one model parameter being stored in association with each of the plurality of types of objects to be transferred;
   a control schedule creating section configured to acquire identification information for identifying the object to be transferred and a movement schedule defining a movement of the substrate transfer module along a time axis, to obtain the operating force to be applied when the substrate transfer module holding the object to be transferred corresponding to the identification information is moved based on the movement schedule using the model parameter of the control model corresponding to the identification information stored in the parameter storage, and to output a control schedule defining the operating force along the time axis; and
   a magnetic force adjusting section configured to perform the feedforward control by adjusting the magnetic force of the first magnets so that the operating force based on the control schedule is applied to the substrate transfer module transferring the object to be transferred corresponding to the identification information.

2. The apparatus of claim 1, wherein the model parameter is a set of at least one of the following parameters (1) to (3):
   (1) a mass of the control model for expressing a relationship between an operating force applied to perform a linear movement and an acceleration
   (2) a moment of inertia of the control model for expressing a relationship between an operating force applied to perform a rotational movement and an angular acceleration
   (3) a mass of the object to be transferred, a moment of inertia of the holder holding the object to be transferred, a spring constant, and a damping coefficient for expressing vibration generated in the holder in order to perform a vibration suppressing operation when the holder formed in an arm shape is regarded as a leaf spring.

3. The apparatus of claim 1, wherein the model parameter is determined based on a theoretical formula expressing a relationship with the movement of the control model.

4. The apparatus of claim 1, wherein the model parameter is determined by machine learning based on a result obtained by actually performing transfer of the object to be transferred using the substrate transfer module multiple times.

5. The apparatus of claim 1, further comprising:
   a sensor configured to detect a position and a posture of the substrate transfer module moving in the substrate processing chamber,
   wherein the controller comprises a feedback correction section configured to compare a position or a posture of the substrate transfer module identified based on the movement schedule with the position or the posture of the substrate transfer module transferring the object to be transferred, detected by the sensor, and to correct adjustment of the magnetic force of the first magnets by the magnetic force adjusting section so that an amount of deviation between the positions or between the postures becomes small.

6. The apparatus of claim 5, further comprising:
   a parameter update section configured to update the model parameter stored in the parameter storage so that a correction amount of the feedback correction section becomes small when a state in which the correction amount exceeds a preset threshold value continues for a preset period of time.

7. The apparatus of claim 6, wherein the parameter update section updates the model parameter so that the correction amount becomes small by machine learning based on a result obtained by actually performing transfer of the object to be transferred using the substrate transfer module multiple times.

8. The apparatus of claim 1, wherein the substrate transfer module is configured such that a plurality of the substrate transfer modules cooperate to transfer the object to be transferred, and
   the magnetic force adjusting section adjusts the magnetic force of the first magnets so that the feedforward control is performed on one of the substrate transfer modules as a master device and the operating force causing the other substrate transfer module as a slave device to move following the master device is applied to the slave device.

9. A method of transferring a substrate to a substrate processing chamber using a substrate transfer module accommodated in a substrate transfer chamber having a floor provided with first magnets and a side wall connected to the substrate processing chamber and formed with an opening through which the substrate is loaded into and unloaded from the substrate processing chamber, the substrate transfer module comprising a holder configured to hold each of a plurality of types of objects to be transferred, which are the substrate or equipment used in the substrate transfer chamber or the substrate processing chamber, and second magnets having a repulsive force acting on the first magnets, and the substrate transfer module being configured to be movable in the substrate transfer chamber by magnetic levitation using the repulsive force, the method comprising:

determining a model parameter for expressing a relationship between an operating force applied to a control model in which the object to be transferred and the substrate transfer module are integrated and a movement of the control model, the model parameter being corresponding to each of the plurality of types of objects to be transferred;

acquiring identification information for identifying the object to be transferred and a movement schedule defining a movement of the substrate transfer module along a time axis, obtaining the operating force to be applied when the substrate transfer module holding the object to be transferred corresponding to the identification information is moved based on the movement schedule using the model parameter of the control model corresponding to the identification information determined in said determining the model parameter, and outputting a control schedule defining the operating force along the time axis; and performing feedforward control by adjusting the magnetic force of the first magnets so that the operating force based on the control schedule is applied to the substrate transfer module transferring the object to be transferred corresponding to the identification information.

10. The method of claim 9, wherein the model parameter is a set of at least one of the following parameters (1) to (3):

(1) a mass of the control model for expressing a relationship between an operating force applied to perform a linear movement and an acceleration (2) a moment of inertia of the control model for expressing a relationship between an operating force applied to perform a rotational movement and an angular acceleration (3) a mass of the object to be transferred, a moment of inertia of the holder holding the object to be transferred, a spring constant, and a damping coefficient for expressing vibration generated in the holder in order to perform a vibration suppressing operation when the holder formed in an arm shape is regarded as a leaf spring.

11. The method of claim 9, wherein the model parameter is determined based on a theoretical formula expressing a relationship with the movement of the control model.

12. The method of claim 9, wherein the model parameter is determined by machine learning based on a result obtained by actually performing transfer of the object to be transferred using the substrate transfer module multiple times.

13. The method of claim 9, further comprising:

detecting a position and a posture of the substrate transfer module moving in the substrate processing chamber; and performing feedback correction for comparing a position or a posture of the substrate transfer module identified based on the movement schedule in said performing the feedforward control with the position or the posture of the substrate transfer module transferring the object to be transferred detected in said detecting, and correcting adjustment of the magnetic force of the first magnets so that an amount of deviation between the positions or between the postures becomes small.

14. The method of claim 13, further comprising updating the model parameter determined in said determining the model parameter so that a correction amount of the feedback correction for correcting adjustment of the magnetic force of the first magnets in said performing the feedback correction becomes small when a state in which the correction amount exceeds a preset threshold value continues for a preset period of time.

15. The method of claim 14, wherein the model parameter is updated so that the correction amount becomes small by machine learning based on a result obtained by actually performing transfer of the object to be transferred using the substrate transfer module multiple times in said updating the model parameter.

16. The method of claim 9, wherein, when a plurality of the substrate transfer modules cooperate to transfer the object to be transferred, the magnetic force of the first magnets is adjusted so that the feedforward control is performed on one of the substrate transfer modules as a master device and the operating force causing the other substrate transfer module as a slave device to move following the master device is applied to the slave device in said performing the feedforward control.

\* \* \* \* \*